(12) United States Patent
Terashima

(10) Patent No.: US 7,595,536 B2
(45) Date of Patent: Sep. 29, 2009

(54) SEMICONDUCTOR DEVICE

(75) Inventor: Tomohide Terashima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 427 days.

(21) Appl. No.: 11/423,013

(22) Filed: Jun. 8, 2006

(65) Prior Publication Data

US 2007/0063293 A1    Mar. 22, 2007

(30) Foreign Application Priority Data

Sep. 22, 2005    (JP)    ............................. 2005-274992

(51) Int. Cl.
*H01L 27/088*    (2006.01)

(52) U.S. Cl. ...................... 257/393; 257/133; 257/192; 257/206

(58) Field of Classification Search ................... 257/27, 257/133, 187, 192, 206, 393
See application file for complete search history.

(56) References Cited

U.S. PATENT DOCUMENTS

| | | | |
|---|---|---|---|
| 5,313,082 A | 5/1994 | Eklund | |
| 5,801,418 A | 9/1998 | Ranjan | |
| 6,124,628 A | 9/2000 | Fujihira et al. | |
| 6,809,393 B1 | 10/2004 | Yamazaki | |
| 6,864,550 B2 * | 3/2005 | Terashima | .................. 257/393 |
| 2004/0071026 A1 | 4/2004 | Hidaka | |
| 2005/0045964 A1 | 3/2005 | Henmi et al. | |

OTHER PUBLICATIONS

Nov. 14, 2008 First Office Action from Chinese Application No. 200610105869.8.

\* cited by examiner

*Primary Examiner*—Fernando L Toledo
(74) *Attorney, Agent, or Firm*—Oblon, Spivak, McClelland, Maier & Neustadt, L.L.P.

(57) ABSTRACT

A semiconductor device that can prevent an unnecessary current path from being formed so that a normal signal is transmitted is provided. The semiconductor device comprises an $N^-$ region formed in a surface region of a P type substrate, a P region formed in the surface region, the P region included in the $N^-$ region or adjacent to the $N^-$ region, one or more semiconductor elements each of which has a first N type region and a second N type region formed in a portion of the P region, the first N type region and the second N type region being separated from each other, a first electrode formed on the first N type region, a second electrode formed on the second N type region, and a gate electrode formed over a surface of the P region between the first N type region and the second N type region. The first N type region and the second N type region are surrounded by the P region and separated from the $N^-$ region.

16 Claims, 20 Drawing Sheets

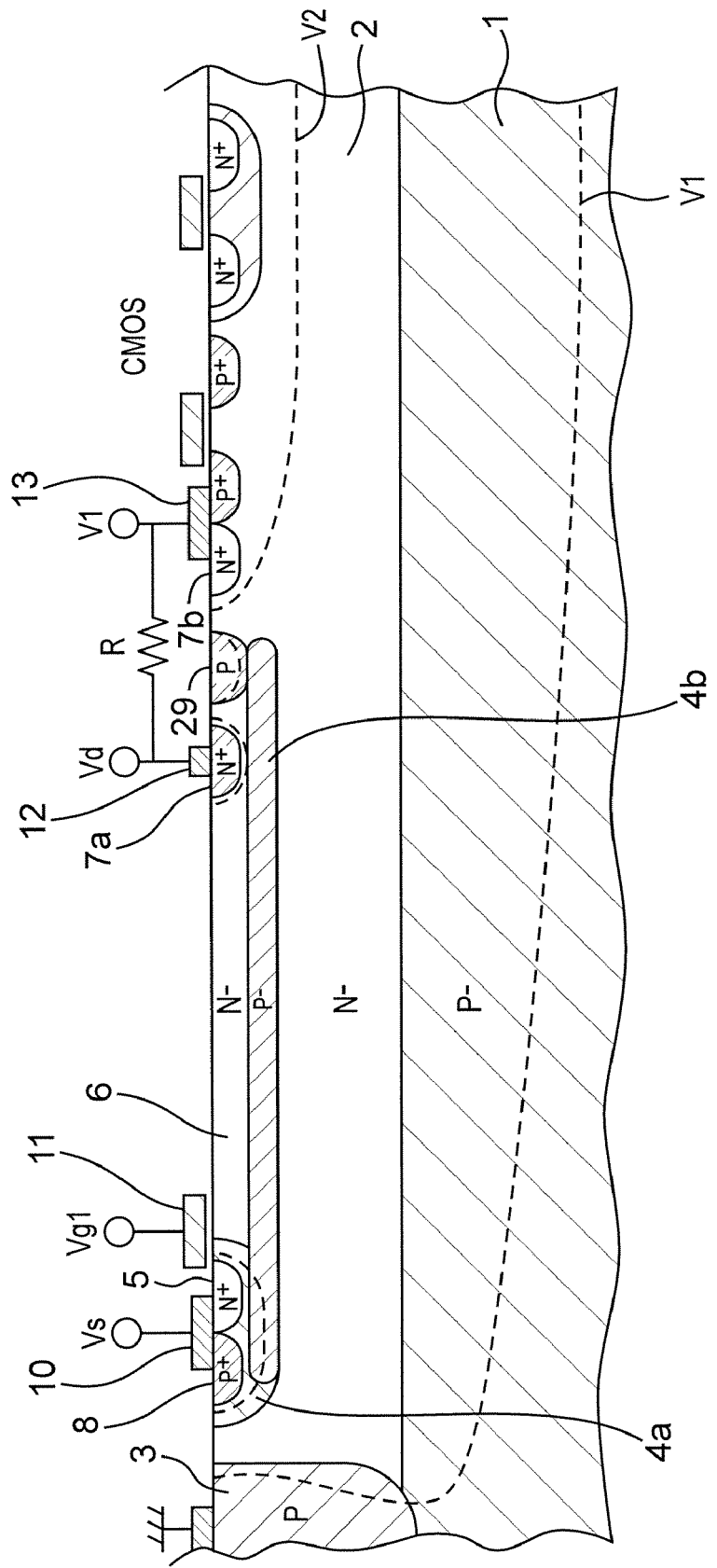

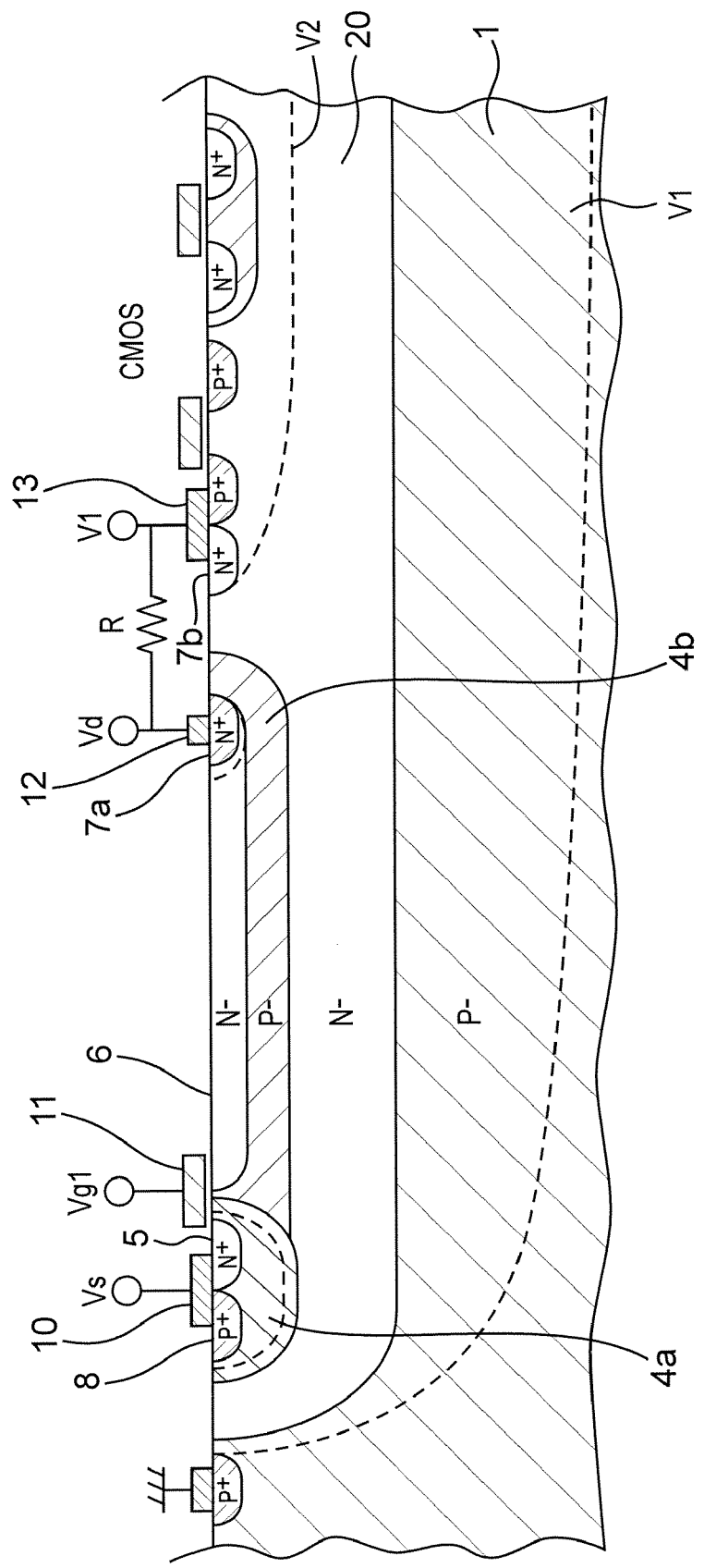

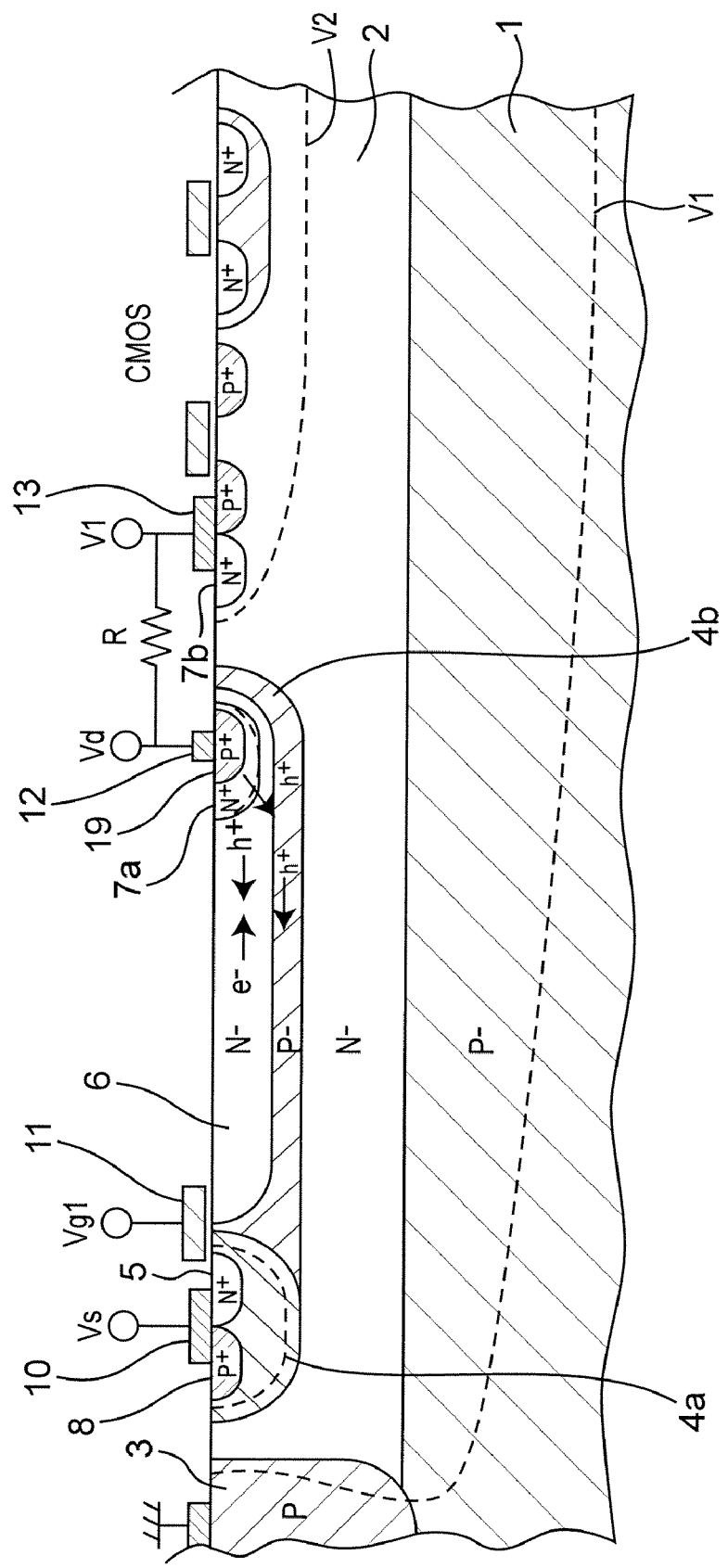

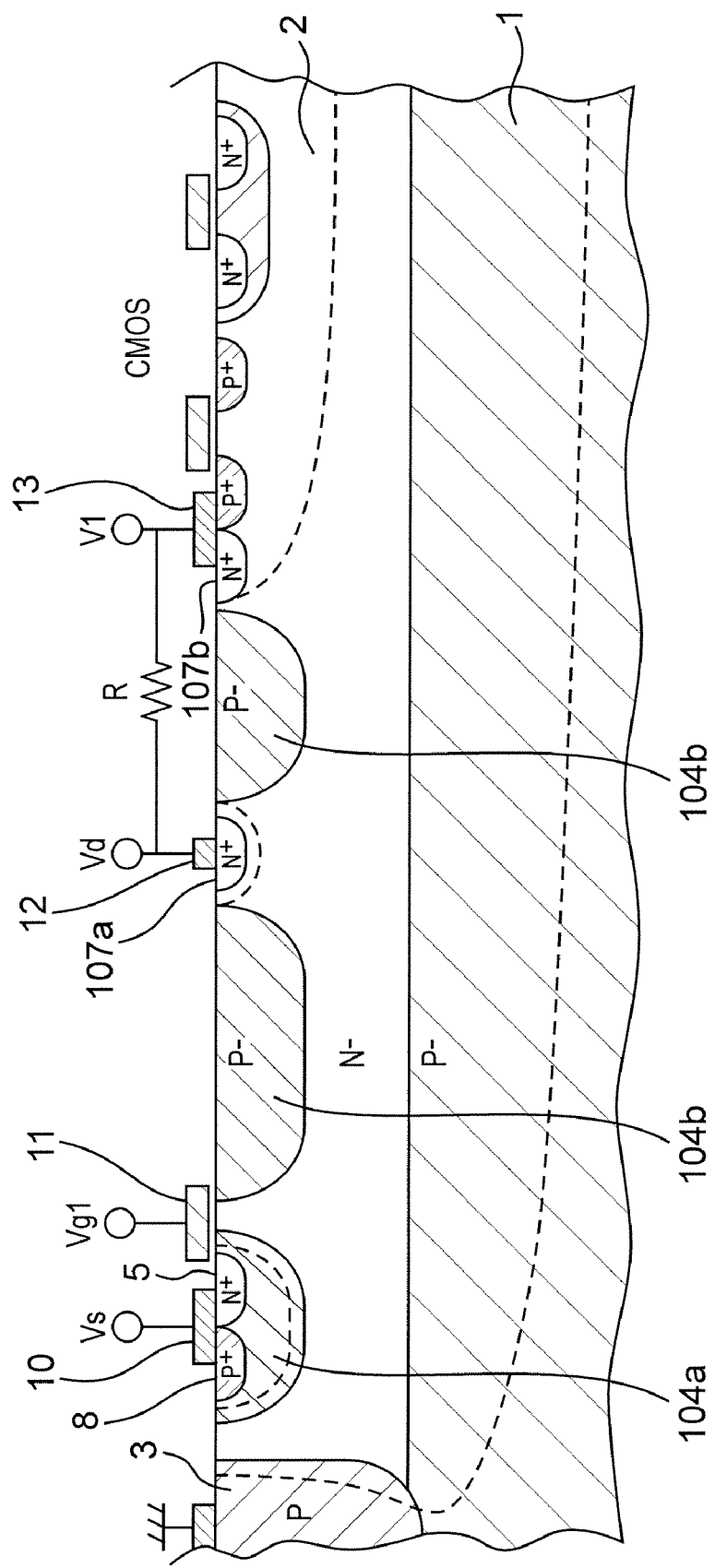

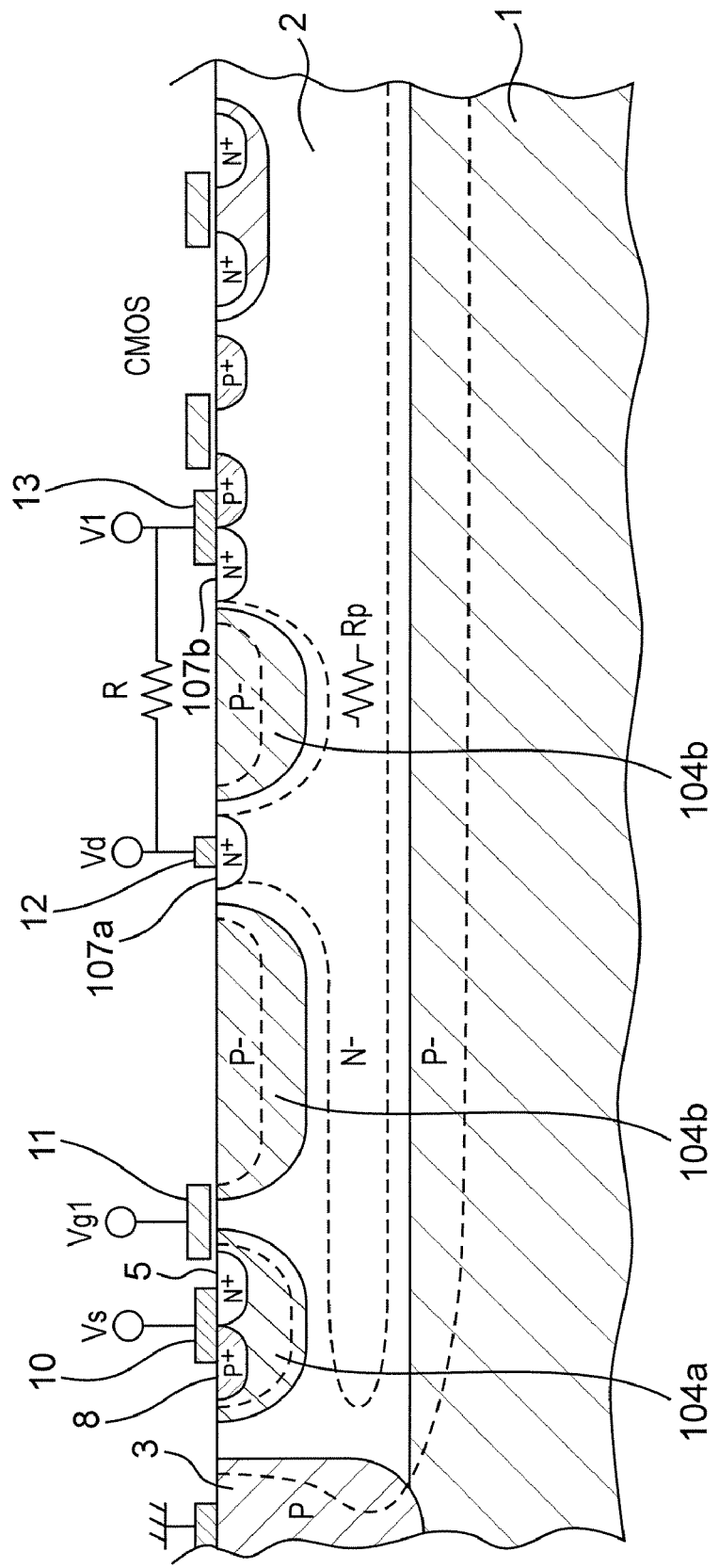

SEMICONDUCTOR DEVICE

BACKGROUND OF THE INVENTION

1. Field of the Invention

The present invention relates to a semiconductor device including an NMOSFET for use in a level shift circuit, for example.

2. Description of the Related Art

For example, a drive circuit for a gate of an insulated-gate bipolar transistor (IGBT) on the side of a high side is configured using a semiconductor substrate 1 as shown in, for example, FIGS. 16 and 18.

This drive circuit, as shown in FIG. 19, includes two level shift circuits each of which is constituted of an NMOSFET 131 (or 132) and a resistor R and high side control logic 51 and a low side control logic 52 each of which is constituted of a CMOS logic, thereby acting as a circuit to drive gates of IGBTs 61 and 62. A high-voltage power integrated circuit that includes a level shift circuit for outputting a signal having a level thus shifted has been available conventionally (see U.S. Pat. No. 5,801,418, for example) typically for use in a CMOS logic of a circuit to drive a high side gate of an IGBT in a half-bridge connection by use of IGBTs as shown in FIG. 19. Note that a CMOS transistor shown in FIG. 16 and other drawings has an exemplary configuration that operates on a floating power source.

In FIGS. 16 and 18, a reference numeral 1 indicates a P⁻ substrate, a reference numeral 2 indicates an N⁻ epitaxial layer, a reference numeral 3 indicates a P region formed to reach the P⁻ substrate 1 from a surface of the N⁻ epitaxial layer 2, a reference numeral 104a indicates a P region formed in the surface of the N⁻ epitaxial layer 2, and a reference numeral 104b indicates a P⁻ region separately formed from the P region 104a in such a manner so as to conduct to the P⁺ region 3 (see FIG. 18).

Further, a reference numeral 5 indicates an N⁺ region formed in a surface of the P region 104a, a reference numeral 107a indicates an N⁺ region formed in the surface of the N⁻ epitaxial layer 2 so as to be surrounded by the P⁻ region 104b, a reference numeral 107b indicates an N⁺ region formed outside the P⁻ region 104b, a reference numeral 8 indicates a P⁺ region formed in the surface of the P region 104a, a reference numeral 9 indicates a substrate electrode formed so as to be in contact with the P⁺ region 3, a reference numeral 10 indicates a source electrode formed so as to be in contact with the N⁺ region 5 and the P⁺ region 8, a reference numeral 11 indicates a gate electrode formed on an insulation film on the surface of the P region 104a sandwiched between the N⁺ region 5 and the N⁻ epitaxial region 2, a reference numeral 12 indicates a drain electrode so as to be in contact with the N⁺ region 107a, and a reference numeral 13 indicates a floating power source electrode formed on the surface of the N⁺ region 107b.

FIG. 16 shows an example of applying a double-resurf technology for equalizing a surface electric field and illustrates an extension (portion sandwiched between two dotted lines) of a depletion layer in a case where Vout has reached a maximum possible potential (≈Vh), to persuade that in this case the N⁻ layer 2 and the P⁻ region 4b are depleted simultaneously upon voltage application but a resultant depletion layer does not reach the above-described CMOS regions, so that the device can operate normally in a condition where its potential is kept high with respect to a substrate potential.

In a circuit configuration shown in FIG. 19, the NMOS transistor 131 or 132 is indispensable which transmits a logic signal based on an ordinary reference substrate potential to a logic circuit having a floating potential, so that in a provided planar configuration shown in FIG. 18, NMOS transistors are configured which respectively have cross-sectional structures shown in FIG. 16. In the drive circuit thus configured, when the NMOS transistor 131 is turned ON, a current flows through the resistor R, thereby giving rise to a difference in potential between V1 and Vd.

It is to be noted that although the N⁺ regions 107a and 107b are connected to each other with the N⁻ epitaxial layer 2, the N⁻ epitaxial layer 2 is depleted to produce a potential barrier of a depletion layer, which in turn cuts off an electron current.

However, in a conventional configuration shown in FIG. 16, such a problem occurs that when a voltage applied to V1 decreases, a non-depleted region occurs in the N⁻ epitaxial layer 2 and has a current path (portion indicated as a resistor Rp in FIG. 17) formed in it.

This problem may lead to such a trouble that an effective value of a resistance of the resistor R is decreased, to disable normal transmission of a signal.

This problem is more serious in a case where a plurality of NMOS transistors is formed (whose top view is shown in FIG. 18 and circuit is shown in FIG. 19) because this JFET is formed between these NMOS transistors and extremely difficult to cope with.

SUMMARY OF THE INVENTION

In view of the above, an object of the present invention is to provide a semiconductor device that can prevent an unnecessary current path from being formed so that a normal signal may be transmitted.

To achieve this object, a semiconductor device according to the present invention that is provided on a P type substrate having an N⁻ region formed on one of its main surfaces and a P region formed in one portion of this N⁻ region or so as to be adjacent thereto includes a first N type region and a second N type region formed in one portion of said P region in a condition where they are separated from each other, a first electrode formed on said first N type region, a second electrode formed on said second N type region, and a gate electrode formed over a surface of said P region between said first N type region and said second N type region, wherein said first N type region and said second N type region are surrounded by said P region and separated from said N⁻ region.

According to the thus configured semiconductor device of the present invention, said first N type region and said second N type region are surrounded by said P region and separated from said N⁻ region, so that it is possible to provide a semiconductor device that can prevent an unnecessary current path from being formed between a semiconductor element and any other circuit element, thereby transmitting a normal signal.

BRIEF DESCRIPTION OF THE DRAWINGS

FIG. 9 a cross sectional view of a semiconductor device of a fourth embodiment related to the present invention;

FIG. 12 is a cross sectional view of a semiconductor device of a sixth embodiment related to the present invention;

FIG. 15 is a cross sectional view of a ninth embodiment related to the present invention;

FIG. 16 is a cross sectional view of a semiconductor device of a conventional example;

FIG. 17 is a cross sectional view showing a depletion layer that is formed in a case where a low voltage is applied to a floating power source electrode in the semiconductor device of the conventional example;

DETAILED DESCRIPTION OF THE PREFERRED EMBODIMENTS

The following will describe a semiconductor device of embodiments related to the present invention with reference to drawings.

First Embodiment

Figure 4:
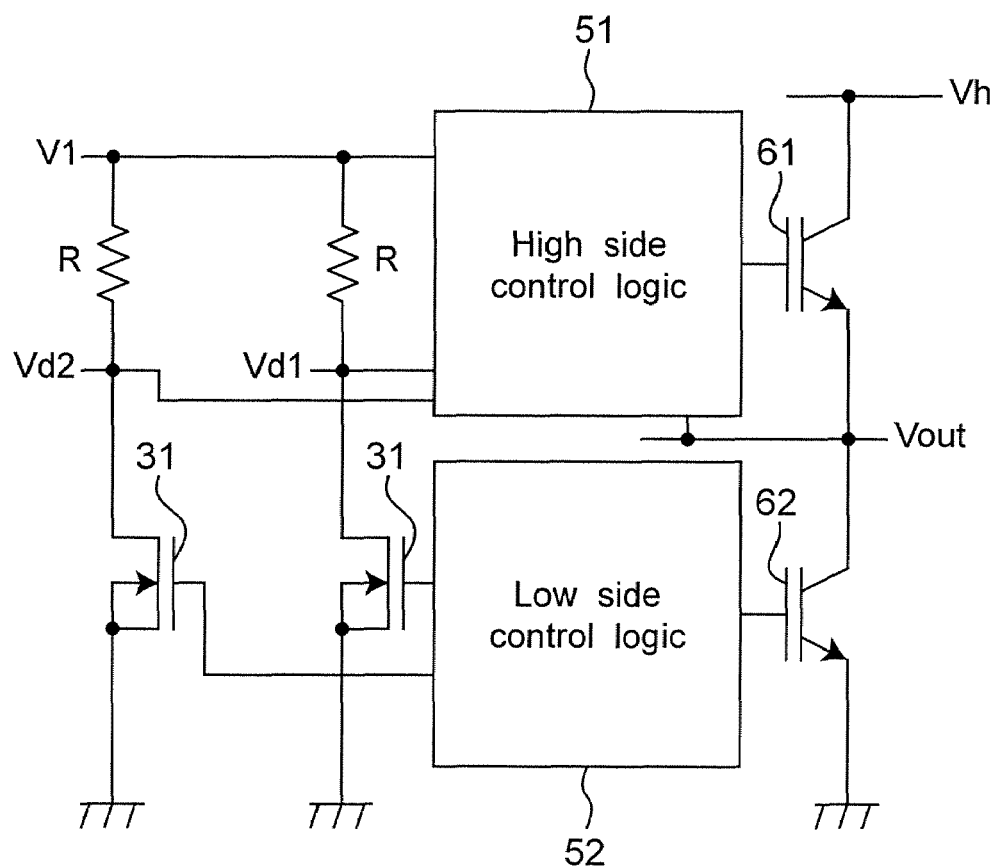
FIG. 4 is a circuit diagram of the semiconductor device of the first embodiment.

A semiconductor device of the present first embodiment is a drive circuit for gates of insulated-gate bipolar transistors (IGBTs) 61 and 62 provided on a P type substrate 1 in one of which surfaces an $N^-$ epitaxial layer 2 is formed, which drive circuit includes, as shown in FIG. 4, a high side control logic 51 and a low side control logic 52 connected to the respective gates of the IGBTs 61 and 62 and two level shift circuits each of which is constituted of an NMOSFET 31 and a resistor R.

Figure 3A:
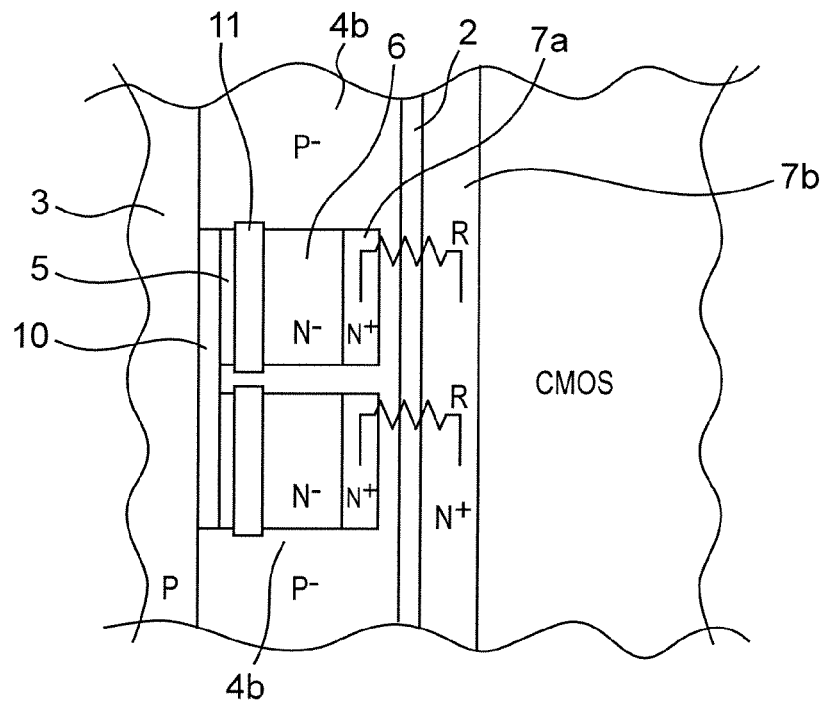
FIG. 3A is a plan view of the semiconductor device of the first embodiment in a case where a source potential is commonly given to two NMOSFETs.
Figure 3B:
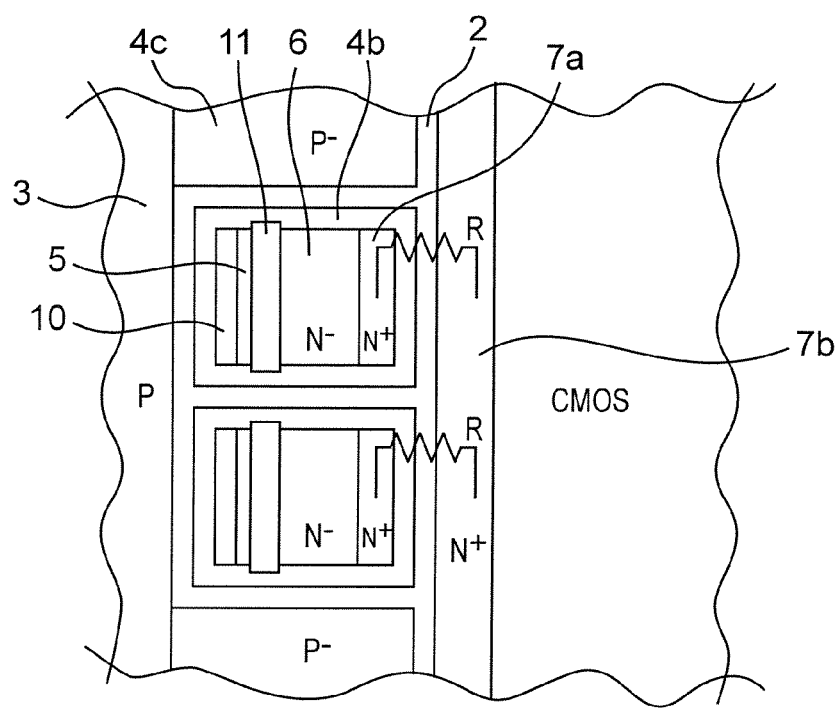
FIG. 3B is a plan view of the semiconductor device of the first embodiment.

Specifically, as shown in FIG. 3B, the high side control logic 51 and the low side control logic 52 are formed in a CMOS region of the P type substrate 1 and the two NMOS-FETs 31 are arranged side by side in a condition where they are separated from each other by a P region 4, in such a configuration that the resistor R is arranged between each of the NMOSFETs 31 and the high side control logic 51 in the CMOS region.

A CMOS transistor in this CMOS region operates on a floating power source and is typically used in a CMOS logic that constitutes the drive circuit for the gate of the high side IGBT in a half-bridge connection by use of IGBTs as shown in FIG. 4.

It is to be noted that the semiconductor device of the present first embodiment features that the NMOSFETs 31 of the level shift circuits are surrounded by a P region and separated from the $N^-$ epitaxial layer 2, so that an unnecessary connection is prevented from being formed between the NMOSFETs 21 and 22 and any other circuit element.

Figure 1:
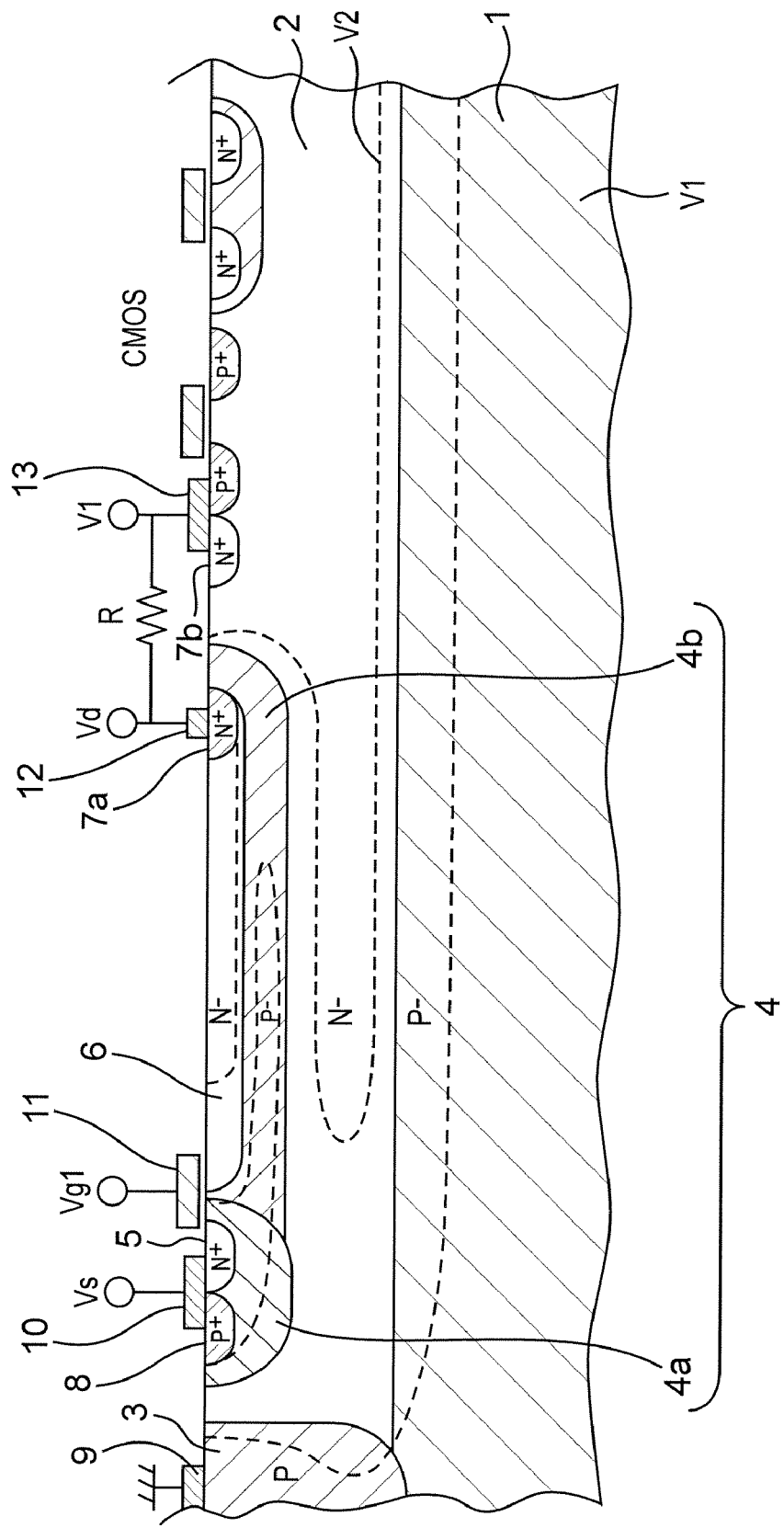
FIG. 1 is a cross sectional view of a semiconductor device of a first embodiment related to the present invention.

The following will more specifically describe the semiconductor device of the first embodiment with reference to FIG. 1 showing a cross section of the NMOSFETs 31 and a schematic cross section of the CMOS region.

The semiconductor device of the present first embodiment is configured using the P type substrate 1, in one of two surfaces of which the $N^-$ epitaxial layer 2 is formed as described above.

Specifically, first, in one portion of the $N^-$ epitaxial layer 2, the P region 4 is provided in which the NMOSFETs are to be formed. This P region 4 is constituted from, for example, a P region $4a$ and a $P^-$ region $4b$ and formed into such a depth as not to reach from a surface of the $N^-$ epitaxial layer 2 to the P type substrate 1 in such a configuration that the $N^-$ epitaxial layer 2 is sandwiched between each of the P region $4a$ and the $P^-$ region $4b$ and the P type substrate 1.

Although in the first embodiment this P region 4 is constituted from the P region $4a$ and the $P^-$ region $4b$ having different carrier concentrations as a preferable aspect, the present invention is not limited to this, and the P region 4 may be constituted from a single P type layer.

Next, in the P region $4a$, an $N^+$ region 5 is provided which becomes a source region of the NMOSFET, and an $N^-$ region 6 is provided in the $P^-$ region $4b$ at a predetermined interval from the $N^+$ region 5. Further, an $N^+$ region $7a$ to be a drain region is provided on the side far away from the $N^+$ region 5 in the $N^-$ region 6. In the P region $4a$, a $P^+$ region 8 is provided so as to be adjacent to the $N^+$ region 5. Thus, the source region ($N^+$ region 5), the drain region ($N^+$ region $7a$), and a channel region between the $N^+$ region 5 and the $N^-$ region 6 of the NMOSFET are configured, a source electrode is provided across the source region ($N^+$ region 5) and the $P^+$ region 8, a drain electrode 12 is provided on the drain region ($N^+$ region $7a$), and a gate electrode 11 is provided via a gate oxide film (not shown) over the channel region.

It is to be noted that preferably a carrier concentration of the $N^-$ region 6 between the $N^+$ region 5 and the $N^+$ region $7a$ is set such that an electric field on the surface may be uniform (that is, resurf conditions may be satisfied).

In this case, in the present first embodiment, in the P region 4, the $N^+$ region 5, the $N^-$ region 6, and the $N^+$ region $7a$ are formed into such a depth so as not to reach the $N^-$ epitaxial layer 2 and the P region 4 always exists between the $N^-$ epitaxial layer 2 and each of the $N^-$ region 6 and the $N^+$ region $7a$. Accordingly, the N type source and drain of the NMOS-FET are surrounded by a potential barrier due to the P region 4 and separated by this potential barrier from a floating power source electrode 13 provided outside the P region 4 and an MOSFET in the CMOS region.

Next, in the first embodiment, the resistor R and the floating power source electrode to be connected to the above-described MOSFET are provided as described blow, to configure the level shift circuit.

Specifically, outside the P region 4, the floating power source electrode 13 is formed which is connected to the N⁻ epitaxial layer 2. As shown in FIG. 1, for example, this floating power source electrode 13 is provided, so as to be connected to a CMOS logic circuit provided in the N⁻ epitaxial layer 2 outside the P region 4, across the P⁺ region which is the source or the drain of the PMOSFET and the N⁺ region 7b adjacent thereto. Then, the resistor R is connected between the drain electrode 12 and the floating power source electrode 13.

Thus, the level shift circuit of the first embodiment is configured in which the MOSFET, the resistor R, and the floating power source electrode 13 are connected to each other.

It is to be noted that a reference numeral 3 indicates a P⁺ region formed so as to reach from the surface of the N⁻ epitaxial layer 2 to the P⁻ substrate 1, a reference numeral 4c indicates a P⁻ region formed so as to be in contact with the P⁺ region 3, and a reference numeral 9 indicates a substrate electrode formed so as to in contact with the P⁺ region 3. The substrate electrode 9 is grounded.

In such a manner, in the drive circuit of the first embodiment, the two NMOSFETs 31 that transmit a logic signal based on an ordinary substrate potential to a logic circuit having a floating potential are configured. In other words, the circuit utilizes a fact that when the NMOSFET 31 is turned ON, a current flows through the resistor R, to give rise to a difference in potential between V1 and Vd1 (or Vd2) (see a circuit of FIG. 4).

The following will describe a depletion layer which is formed in accordance with the voltage V1 applied to the floating power source electrode 13.

Figure 2:
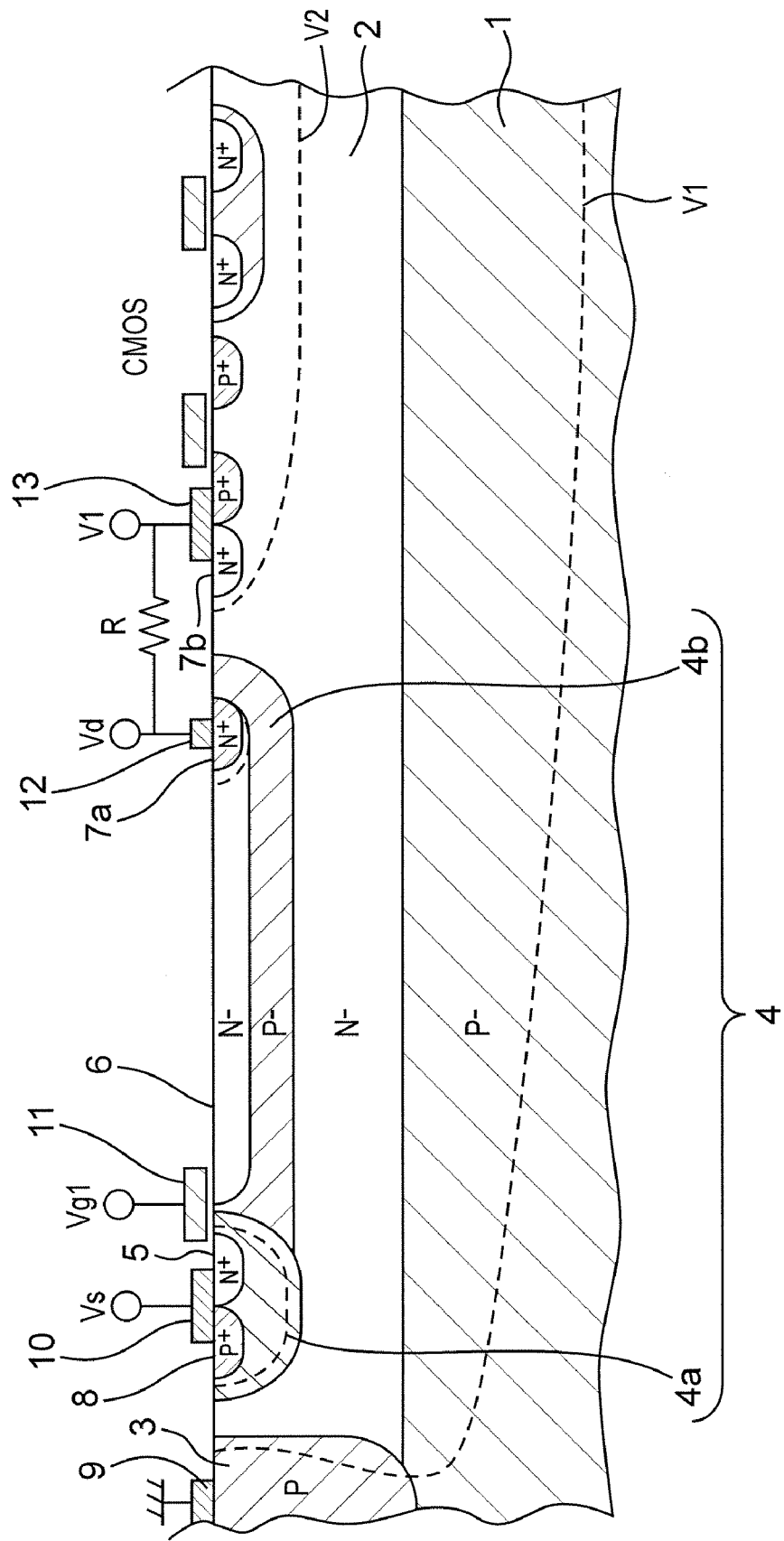
FIG. 2 is a cross sectional view showing a depletion layer formed in a case where a high voltage is applied to a floating power source electrode in the semiconductor device of FIG. 1.

First, when the voltage V1 is high which is applied to the floating power source electrode 13, the present first embodiment employs a triple-resurf structure, in which, as soon as the voltage is applied, the N⁻ epitaxial layer 2, the P⁻ region 4b, and the N⁻ region 6 are depleted simultaneously, thereby uniformizing an electric field on the surface as shown in FIG. 2.

In the triple-resurf structure, an N diffusion layer and a P diffusion layer are disposed alternately in the vertical direction (in this case, the P type substrate 1, the N⁻ epitaxial layer 2, the P⁻ region 4b, and the N⁻ region 6 are laminated), so as to be mutually depleted when a reverse bias voltage is applied, until completely depleted except for the lowest layer region, thereby uniformizing the surface electric field and inhibiting a maximum electric field. A primary operating condition for this depletion is that the above operation is completed before an avalanche occurs.

A maximum allowable amount of accumulated charge not to cause an avalanche in a silicon depletion layer is about $1 \times 10^{12}$ coulomb/cm². In the triple-resurf structure of the first embodiment, the three layers are laminated vertically, so this value is tripled to provide a total amount of accumulated charge of $3 \times 10^{12}$ coulomb/cm².

In the present first embodiment, the accumulated charge amount of the N⁻ epitaxial layer 2 is $2 \times 10^{12}$ coulomb/cm² because it is depleted from both top and bottom simultaneously, and the accumulated charge amount of the N⁻ layer 6 is $1 \times 10^{12}$ coulomb/cm² because it is depleted only from the bottom, thus resulting in a total amount of accumulated charge of $3 \times 10^{12}$ coulomb/cm².

In the first embodiment thus configured, as shown in this FIG. 2, the depletion layer does not reach the above-described CMOS region, so that the device can be operated normally in a condition where its voltage is kept high with respect to a substrate potential.

If, on the other hand, the voltage applied to the floating power source electrode 13 decreases, the P⁻ region 4b is not depleted (FIG. 1). In such a case, in a conventional drive circuit as described in the section of the prior art, a current flowing through the NMOSFET comes into the N⁻ epitaxial layer 2.

In FIGS. 1 and 2, the depletion layer is a region between broken lines V1 and V2. This holds true with the other cross sectional views as well.

In contrast, in the drive circuit of the present invention (the present first embodiment), even if the voltage V1 applied to the floating power source electrode 13 decreases, a potential barrier due to the P⁻ region 4b prevents a current flowing through the NMOS from reaching the N⁻ epitaxial layer 2.

Therefore, in the drive circuit of the present first embodiment, stable driving can be realized without changing an effective value of the resistor R or causing interference between the NMOS transistor, in contrast to the conventional example.

Further, in the drive circuit of the present first embodiment, as shown in FIG. 3B, the two P regions 4 each includes the P region 4a and the P⁻ region 4b are separated from each other and the P region 4 is also separated from the P⁻ region 4c connected to the P region 3. That is, by placing the N⁻ epitaxial layer 2 between the two P regions 4, and between each P region 4 and the P region 3, a potential barrier due to the N⁻ epitaxial layer 2 makes it possible to keep up source potentials of the two NMOSFETs independently of each other, thereby allowing to detect a current flowing through the device on the source side for each of the NMOSFETs.

However, in the present invention, as shown in FIG. 3A, a source potential may be commonly given to the NMOS transistors and also the P region 4a and the P region 3 may be formed so as to be in contact with each other.

Modified Example 1

Although it has been pointed out that preferably a triple-resurf structure is applied to a portion where an NMOSFET is configured in the above description of the first embodiment, a double-resurf structure, for example, may be applied to a portion other than those where the NMOSFET is configured.

However, in a case where a triple-resurf structure is applied to a portion where an NMOSFET is configured, it is preferable that the triple-resurf structure is also applied also to a portion other than those where the NMOSFET is configured.

Figure 5A:
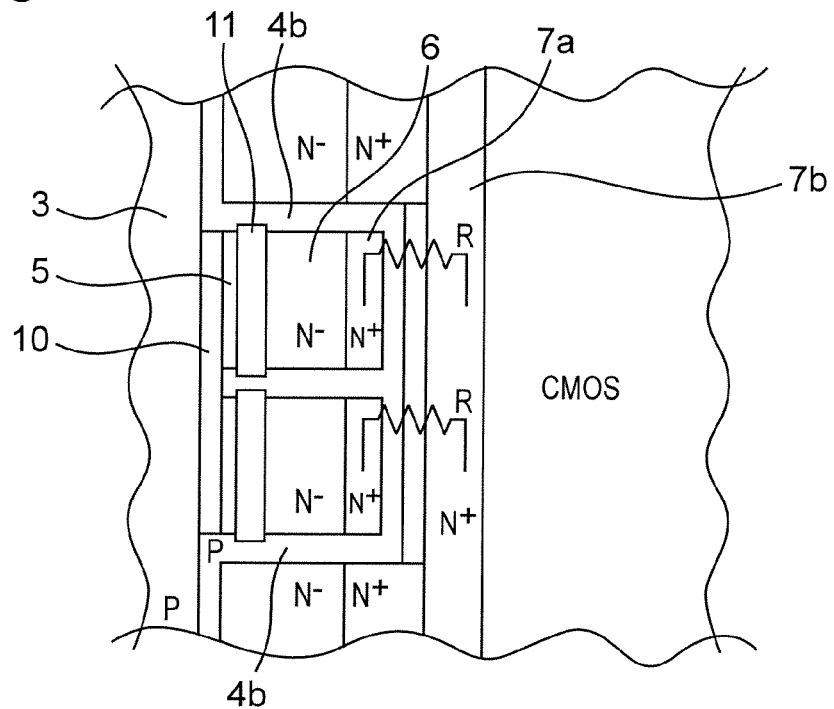
FIG. 5A is a plan view of a semiconductor device according to a modified example 1 of the first embodiment in a case where a source potential is commonly given to two NMOS-FETs.
Figure 5B:
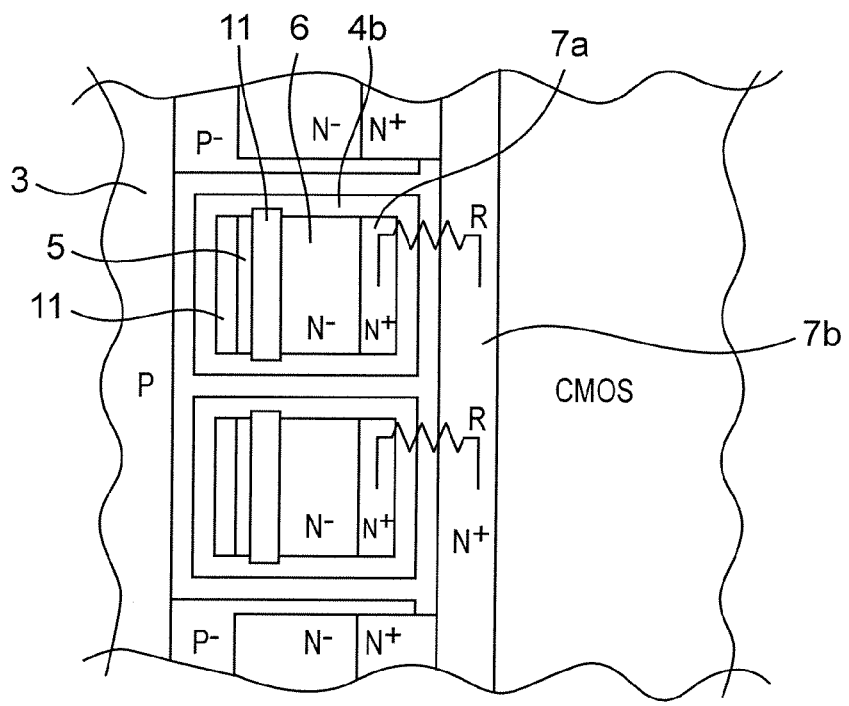
FIG. 5B is a plan view of the semiconductor device of the modified example 1 of the first embodiment.

Specifically, a laminated structure including an N type layer, a P type layer, and an N type layer laminated in this order from the substrate 1 is formed adjacent to a portion other than those where an NMOSFET is configured, and impurity concentrations of these N type layer, P type layer, and N type layer of this laminated structure are set in such a manner that an electric field on the surface is uniform. An example where a triple-resurf structure is applied to a portion other than those where an NMOSFET is as shown in a plan view of FIG. 5A or 5B. FIG. 5A shows an example of FIG. 3A in a case where a triple-resurf structure is applied to a portion other than those where an NMOSFET, and FIG. 5B shows an example of FIG. 3B in a case where the triple-resurf structure is applied to a portion other than those where the NMOSFET.

In other words, if a double-resurf structure is applied to a region where no NMOSFET is formed, it is impossible to optimize relaxation of electric fields in the P⁻ region 4b of a triple-resurf structure and the P⁻ region 4c of the double-resurf structure, unless accumulation concentrations of these regions are changed. In contrast, if the triple-resurf structure is also applied to an outside of the NMOSFET, it is unnecessary to provide the P⁻ region 4c separately, and it is possible to reduce the process cost.

Modified Example 2

In the first embodiment, the P⁻ region 4b or the P⁻ region 4c has been provided on both sides of a portion where an NMOSFET is formed. However, in the present invention the N⁻ epitaxial layer 2 may be exposed in place of the P⁻ region 4b or the P⁻ region 4c provided on both sides of a portion where an NMOSFET is formed.

In such a case, a region where the NMOSFET is formed has a triple-resurf structure and portions other than this region have an ordinary resurf structure. Accordingly, it is necessary to form the N⁻ layer 2 so as to satisfy ordinary resurf conditions, and to form the P⁻ layer 4b and the N⁻ layer 6 as shallow as possible so as not to greatly deviate from triple-resurf conditions in the NMOSFET region.

However, a fatal problem does not occur, since an upper limit is set to an accumulation concentration in the resurf conditions, and the present structure encounters a deviation only in a direction of decreasing accumulation concentrations. Further, a major problem does not occur because countermeasures may be taken to earn a breakdown voltage margin by increasing a length (resurf length) of the N⁻ region 6 only in a portion where the device is formed.

In contrast, the triple-resurf conditions prescribe a narrower optimal range than the ordinary resurf conditions, and accurate process control is necessary. However, according to a structure of FIG. 6A and such, an advantage of the easy manufacturing may be obtained because it is possible to refrain from making the triple-resurf structure as much as possible.

Figure 6A:
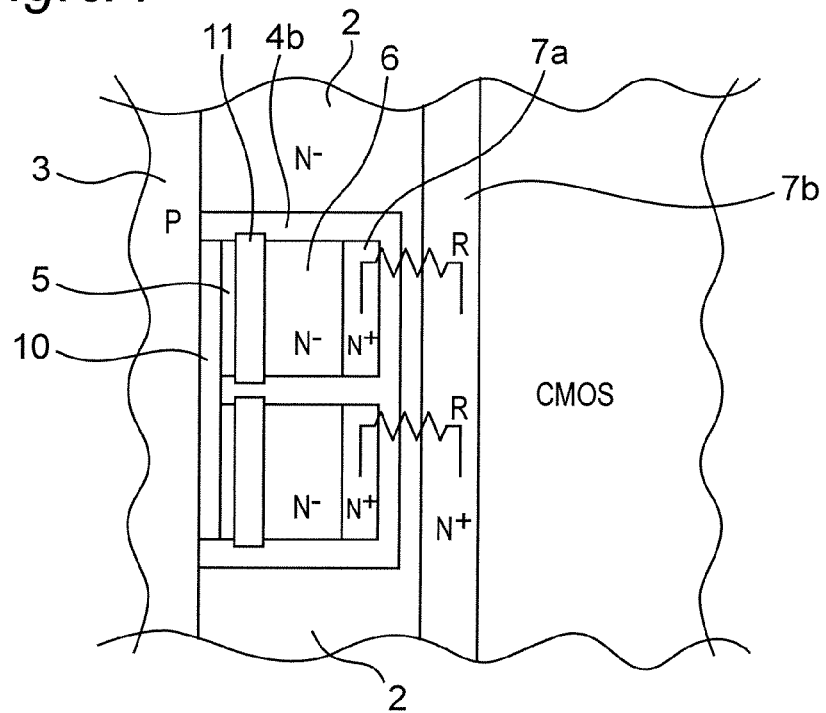
FIG. 6A is a plan view of another semiconductor device according to the modified example 1 of the first embodiment in a case where a source potential is commonly given to the two NMOSFETs.
Figure 6B:
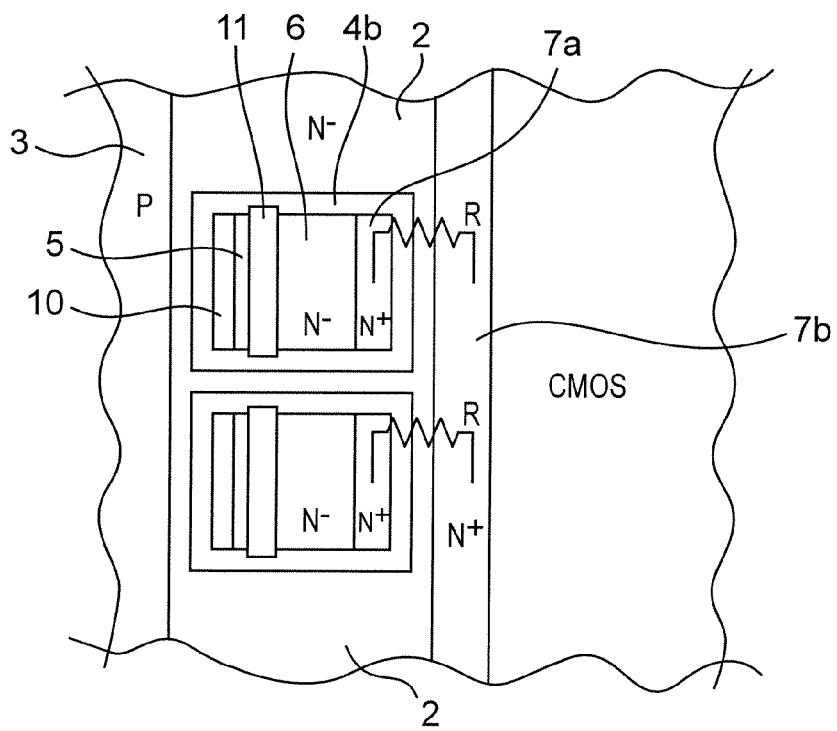
FIG. 6B is a plan view of another semiconductor device of the modified example 1 of the first embodiment.

Note that FIG. 6A corresponds to FIG. 3A, and FIG. 6B to FIG. 3B.

Figure 11:
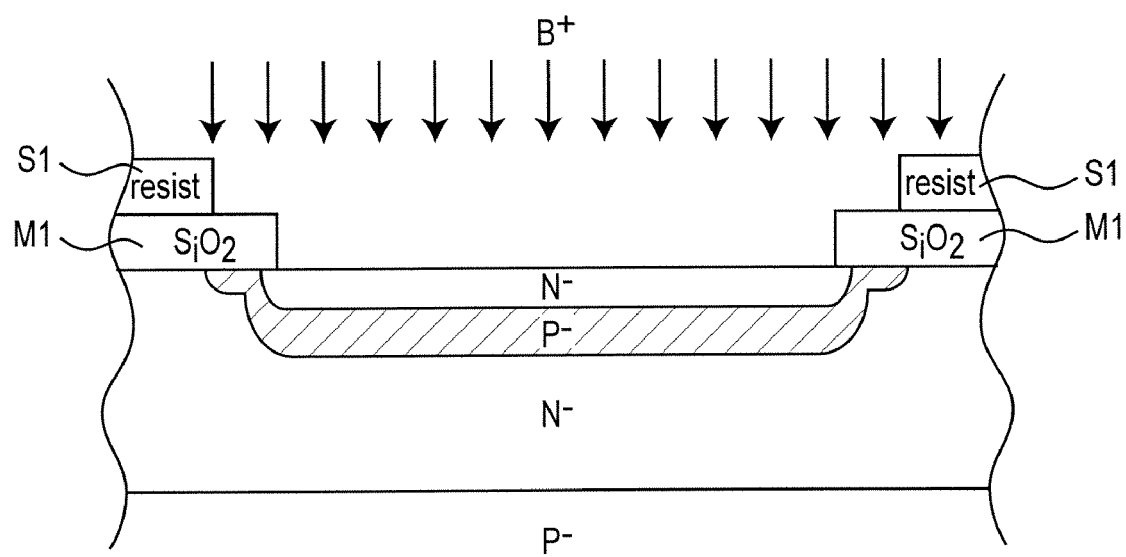
FIG. 11 is a schematic cross sectional view showing one example of forming a P type layer $4b$ of the first embodiment.

According to the above-described first embodiment, the P⁻ region 4b that separates the region where an NMOSFET is formed and the N⁻ region 2 from each other can be formed easily by utilizing an SiO₂ mask M1 and a photo-resist S1 as shown in FIG. 11, for example. That is, when high-energy implantation is utilized to form the P⁻ region 4b to be buried under the N⁻ region 6, an implantation depth in a region where the mask M1 is formed can be aligned with a level of a surface of Si of the N⁻ epitaxial layer 2, thereby forming the P⁻ region 4b in a bowl shape. In such a manner, by performing an ion implantation process just once, the P⁻ region 4b that separates the N⁻ region 6 from the N⁻ region 2 can be formed, thereby suppressing the process costs.

Second Embodiment

Figure 7:
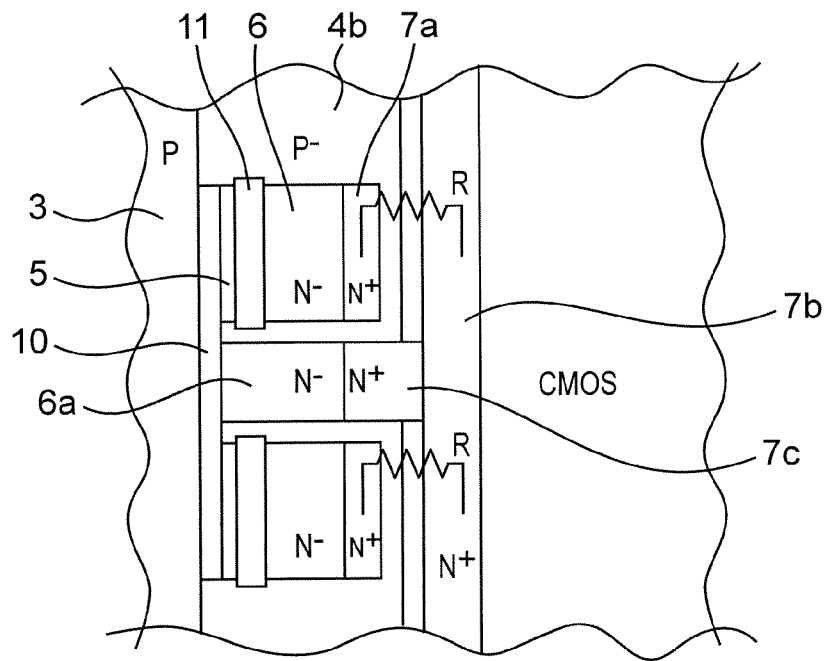
FIG. 7 a plan view of a semiconductor device of a second embodiment related to the present invention.

A semiconductor device of the second embodiment has the same configuration as that of the semiconductor of the first embodiment shown in FIG. 3A except that an N type separation layer constituted from an N⁻ region 6a and an N⁺ region 7c is provided between two NMOSFETs as shown in FIG. 7. In this configuration, the N⁻ region 6a and the N⁺ region 7c are provided as separated from an N⁻ region 6 and an N⁺ region 7a respectively, so that a P⁻ region 4b is sandwiched between the N⁻ region 6a and the N⁻ region 6 and between the N⁺ region 7c and the N⁺ region 7a.

In the semiconductor device of the second embodiment thus configured, presence of the independent N⁻ region 6a and the N⁺ region 7c between the two NMOSFETs eliminates capacitive coupling due to a junction capacitance therebetween, and it is possible to prevent a mutual interaction in transient characteristics, thereby enabling more accurate operation.

Third Embodiment

Figure 8:
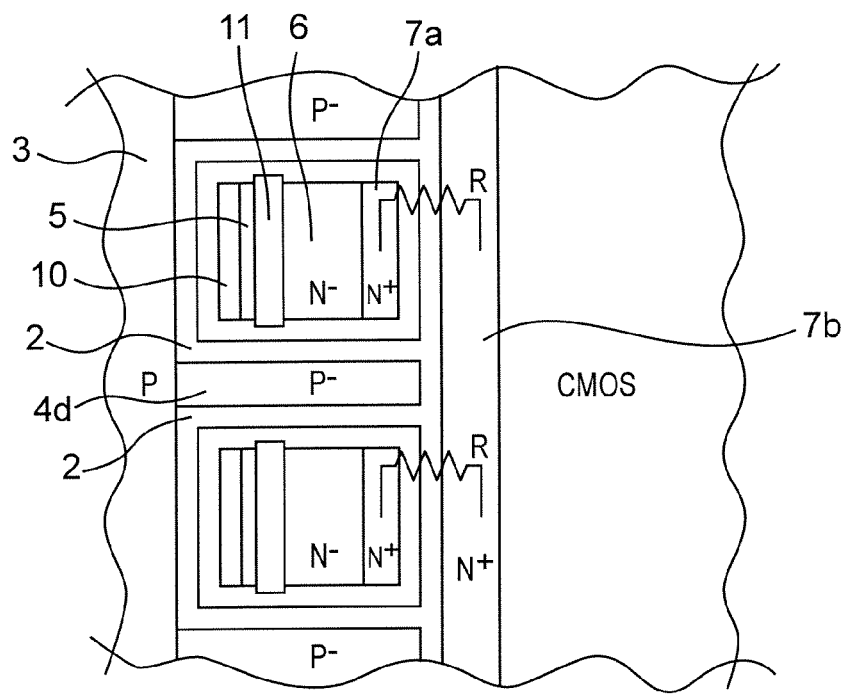
FIG. 8 a plan view of a semiconductor device of a third embodiment related to the present invention.

A semiconductor device of the third embodiment has the same configuration as that of the semiconductor device of the first embodiment shown in FIG. 3B except that a P type separation layer constituted from a P⁻ region 4d is provided between two NMOSFETs as shown in FIG. 8. In this configuration, the P⁻ region 4d is provided in a condition where it is separated from a P region 4 where each of the NMOSFETs is to be formed, so that a N⁻ epitaxial layer 2 is sandwiched between the P⁻ region 4d and the P region 4.

In the semiconductor device of the third embodiment thus configured, presence of the independent P⁻ region 4d between the two NMOSFETs eliminates capacitive coupling due to a junction capacitance therebetween, and it is possible to prevent a mutual interaction in transient characteristics, thereby enabling more accurate operations.

In a structure shown in FIG. 6B, it is possible to reduce capacitive coupling due to a junction capacitance between the NMOSFETs by forming the P region 4 for each NMOSFET and positioned away from each other. However, in the present third embodiment, by providing the P⁻ region 4d between the P regions 4, it is possible to reduce capacitive coupling without increasing the distance between the two P regions 4.

Fourth Embodiment

A semiconductor device of the fourth embodiment has the same configuration as that of the semiconductor device of the first embodiment (FIG. 1) except that as shown in FIG. 9 a P⁻ region 4b is firmed as a layer buried into an N⁻ epitaxial layer 2 and a P region 29 is additionally formed between an N⁺ region 7a and an N⁺ region 7b. It is to be noted that the P⁻ region 4b buried into the N⁻ epitaxial layer 2 may be formed by implanting ions to form the P⁻ region 4b and then epitaxially growing the N⁻ epitaxial layer 2 again, or the P⁻ region 4b may be formed directly through high-energy implantation.

Although the P region 29 is added because it is necessary to cut off the N⁺ regions 7a and 7b from each other by a P type region, no current leakage occurs toward the N⁻ epitaxial layer 2 when the P⁻ region 4b is depleted. Accordingly, the P region 29 may be put in a floating state without being depleted as shown in FIG. 9 when a reverse bias voltage is applied, because.

In the preferred example of the first embodiment, it is necessary to balance between the concentrations of the N⁻ epitaxial layer 2, the P⁻ region 4b, and the N⁻ region 6. However, according to the configuration of the present fourth embodiment, the process can be optimized more easily, because the optimization is necessary only for a relationship between the N⁻ epitaxial layer 2 and the P⁻ region 4b, thus enabling.

Fifth Embodiment

Figure 10A:
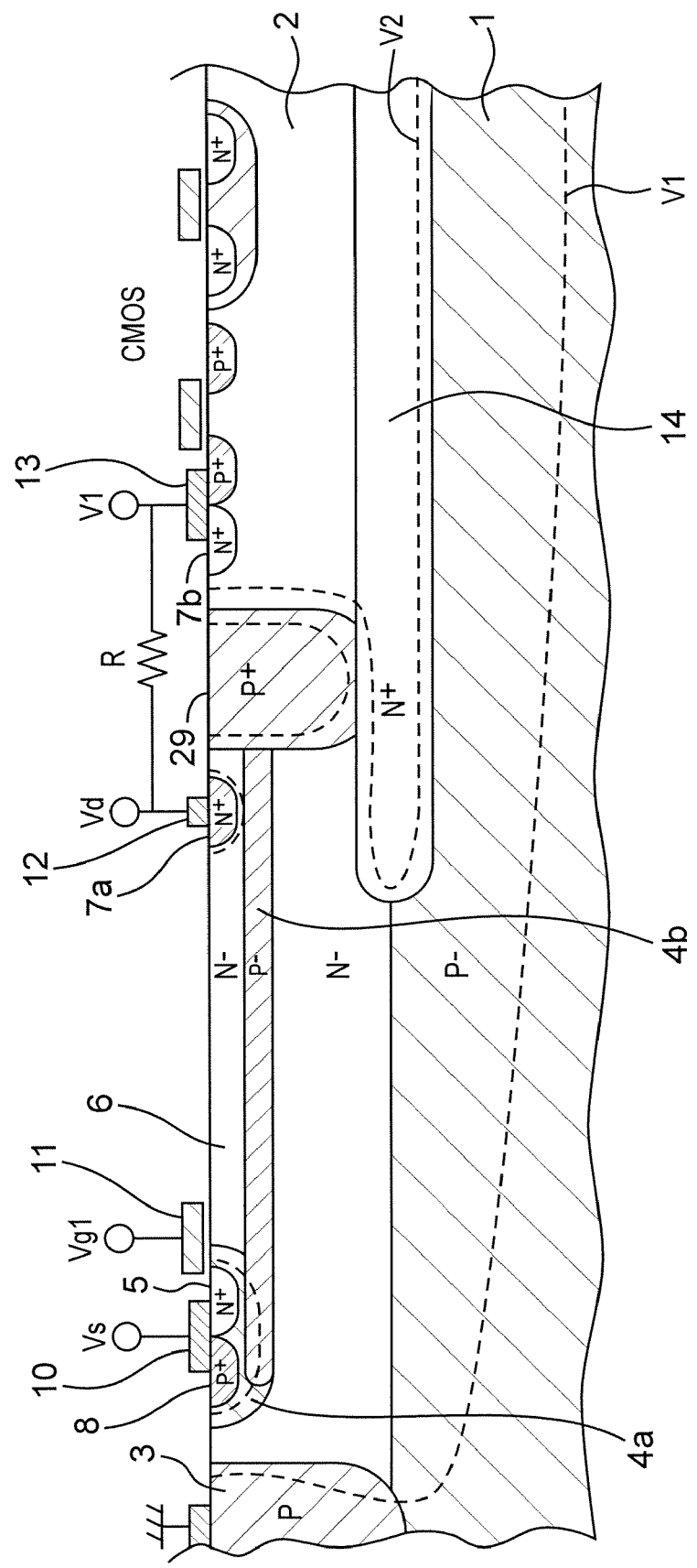
FIG. 10A is a cross sectional view of a semiconductor device of a fifth embodiment related to the present invention.
Figure 10B:
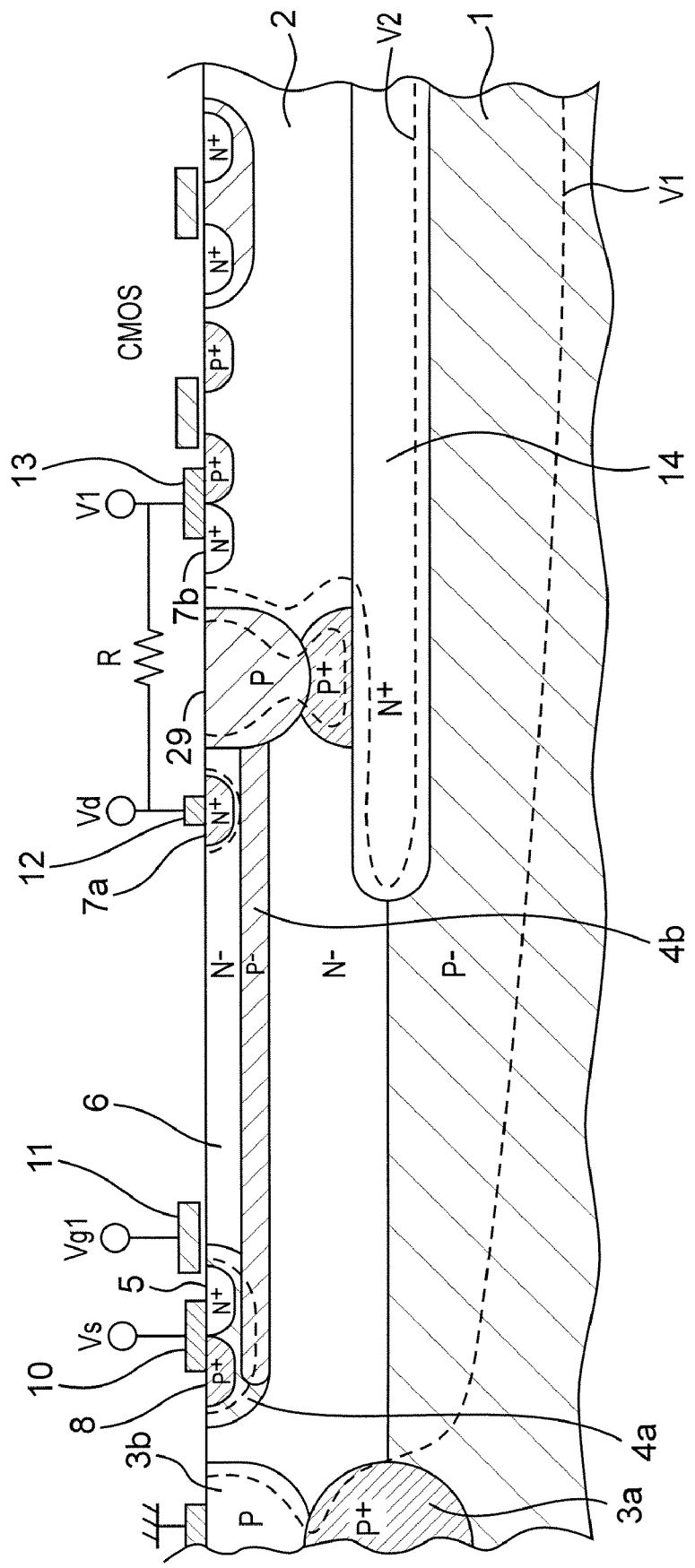
FIG. 10B is a cross sectional view of a semiconductor device related to a modified example of the fifth embodiment.

A semiconductor device of the fifth embodiment has the same configuration as that of the semiconductor device of the fourth embodiment except that, as shown in FIG. 10A, the P region 29 is formed through diffusion like the P region 3, so as to reach the P⁻ layer in the P type substrate 1, and an N⁺ buried region 14 is added in order to keep up a breakdown voltage with respect to the P⁻ substrate 1.

In this semiconductor device of the fifth embodiment, when a reverse voltage is applied, the P region 29 drops in potential until the P⁻ region 4b is depleted and enters a floating state, as shown in FIG. 9. According to this fifth embodiment, the P region 29 can be formed in the same process as the P region 3, for example, and it is possible to reduce the process cost.

It is to be noted that the configuration of the present fifth embodiment is applicable even in a case where the P region 3 is constituted from a P buried region 3a and a P region 3b.

Sixth Embodiment

A semiconductor device of the sixth embodiment has such a configuration that, as shown in FIG. 12, an N⁻ diffusion layer 20 is formed in place of the N⁻ epitaxial layer 2 of the first embodiment and, in this N⁻ diffusion layer 20, an NMOSFET and a CMOS transistor are configured like in the case of the first embodiment.

A drive circuit of the sixth embodiment thus configured is not required to form the P region 3, and employs diffusion processing, which is more inexpensive than epitaxial growth. Accordingly, it is possible to reduce the process cost. This method can also be applied to the fourth embodiment and such, providing the same effects.

Seventh Embodiment

Figure 13A:
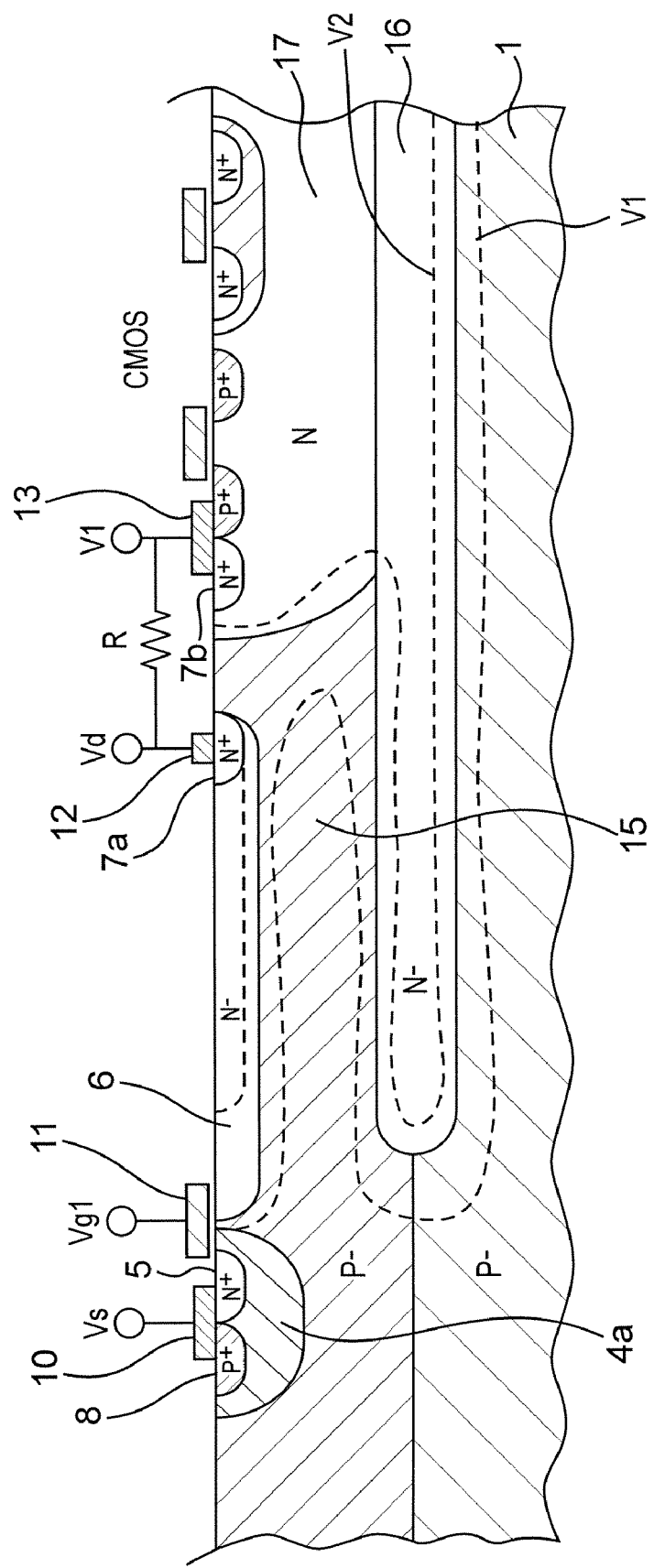
FIG. 13A is a cross sectional view of a seventh embodiment related to the present invention.

In a semiconductor device of the seventh embodiment, as shown in FIG. 13A, on the P type substrate 1, an N⁻ buried region 16 whose concentration has been adjusted so as to satisfy resurf conditions is provided, and a P⁻ layer 15 in which an NMOSFET is to be formed and an N layer 17 in which a CMOS transistor is to be formed are formed on the N⁻ buried region 16. Then, the NMOSFET is formed in the P⁻ layer 15, and the floating power source electrode 13 connected to the CMOS is formed in the N layer 17. Also in a drive circuit of this seventh embodiment, like the first embodiment, the NMOSFET formed in the P⁻ layer 15 is surrounded by the P⁻ layer 15 and completely separated from the floating power source electrode 13, and accordingly, it is possible to provide almost the same effects as the first embodiment.

Figure 13B:
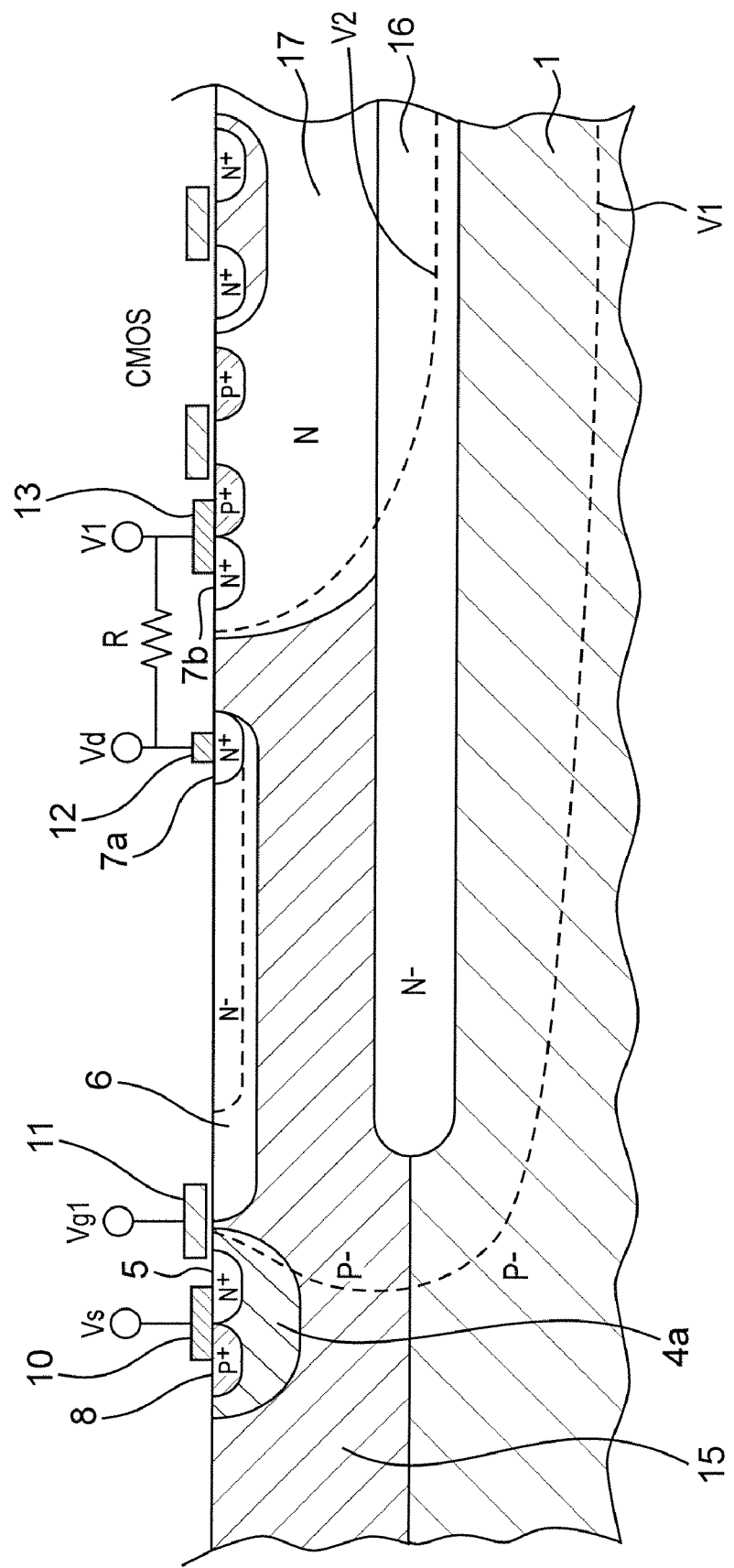
FIG. 13B is a cross sectional view showing how a depletion layer is formed when a reverse bias voltage is increased in a semiconductor device of the seventh embodiment.

Further, the drive circuit of the seventh embodiment thus configured has advantages that a high breakdown voltage can be obtained by the depletion as shown in FIG. 13B when the reverse bias voltage is increased, and concentration adjustment for the purpose of optimizing resurf conditions can be performed more easily than the first embodiment because the N⁻ region 6 is formed directly in the P⁻ layer 15 in the present configuration.

Eighth Embodiment

Figure 14A:
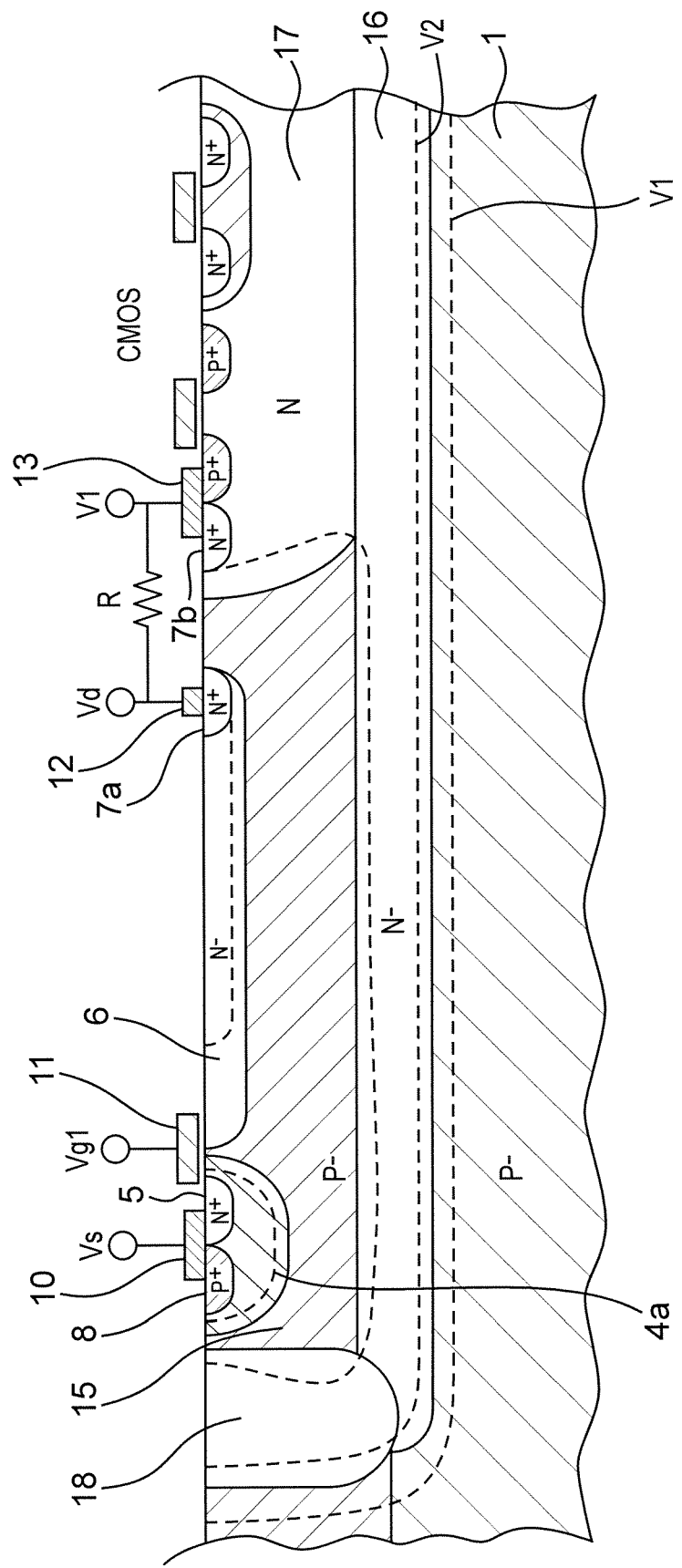
FIG. 14A is a cross sectional view of an eighth embodiment related to the present invention.
Figure 14B:
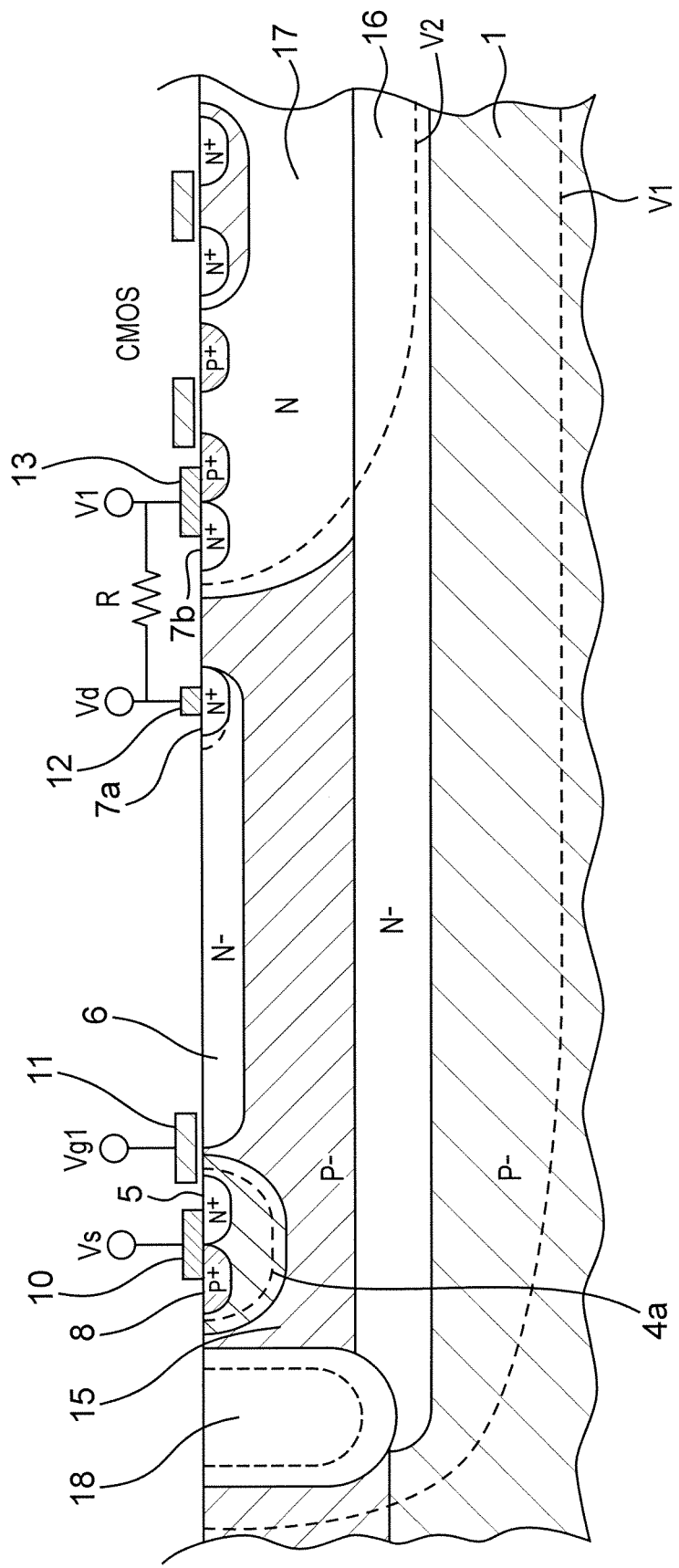
FIG. 14B is a cross sectional view showing how a depletion layer is formed when a reverse bias voltage is increased in a semiconductor device of the eighth embodiment.
Figure 18:
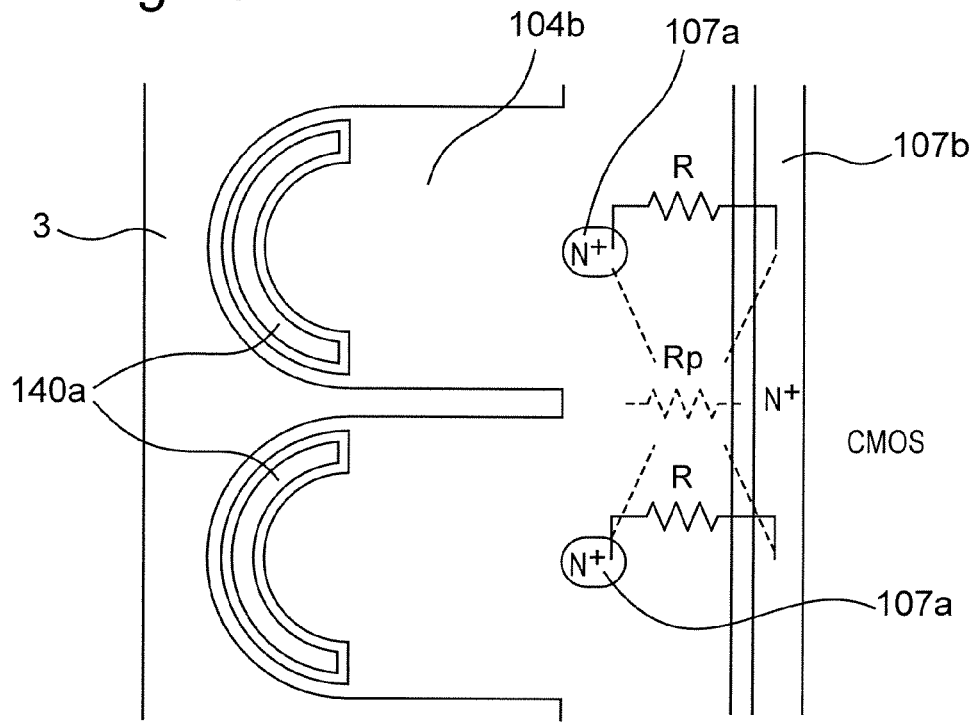
FIG. 18 is a plan view of the semiconductor device of the conventional example.
Figure 19:
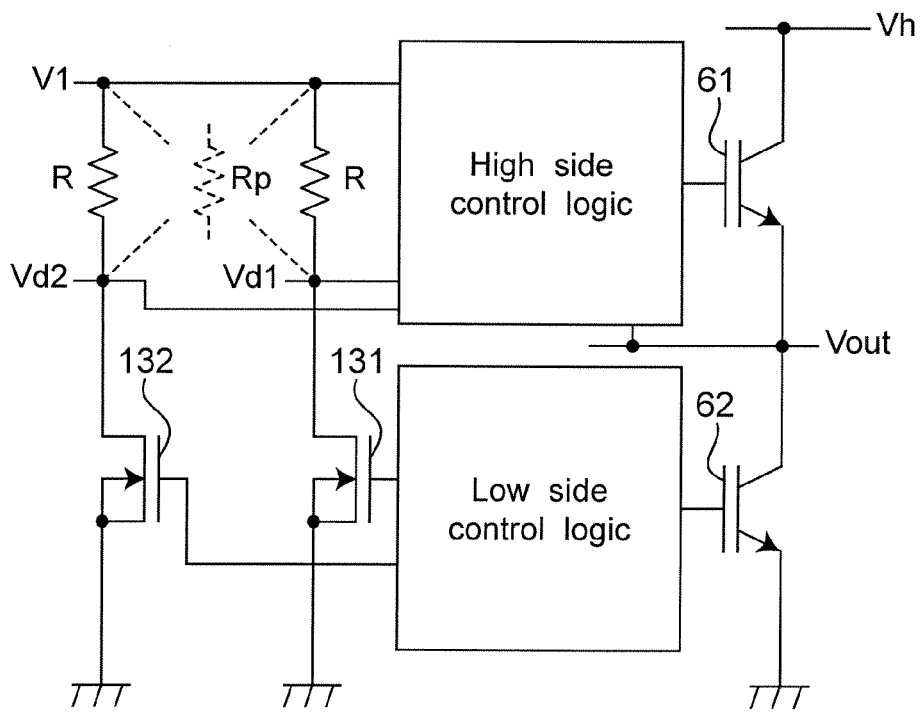
FIG. 19 is a circuit diagram of the semiconductor device of the conventional example.

A semiconductor device of the eighth embodiment has the same configuration as that of the semiconductor device according to the seventh embodiment except that, as shown in FIG. 14A, an N region 18 that reaches an N⁻ buried region 16 is added. The present eighth embodiment employs such a configuration that, if a plurality of NMOS transistors are to be built in, a source electrode may be shared as in the case of a structure shown in FIG. 3A, but the P region 4a and the P⁻ substrate 1 can be separated from each other by the N region 18. However, in a drive circuit of the eighth embodiment, if the reverse bias voltage is increased, as shown in FIG. 14B, the N⁻ region 6, the P⁻ layer 15, and the N⁻ buried region 16 are all depleted, and the N region 18 is depleted or enters a floating state (FIG. 14B shows the floating state). It is thus possible to maintain source respective potentials of the plurality of NMOSFETs independently, allowing to detect a current flowing through the device on the source side for each of the NMOS transistors.

Ninth Embodiment

A semiconductor device of the ninth embodiment has the same configuration as that of the first embodiment except that, as shown in FIG. 15, an IGBT is introduced in place of an NMOSFET by forming a P⁺ region 19 in the N⁺ region 7a.

By replacing the NMOSFET with the IGBT, it is possible to greatly increase an on-state current due to implantation of holes from the P⁺ region 19, as compared to the case of the first embodiment. It is to be noted that the holes implanted from the P⁺ region 19 in an on-state of this IGBT do not flow out of the P⁻ region 4b owing to a potential barrier due to the P⁻ region 4b.

Furthermore, by configuring each P⁻ region 4b independently as shown in FIG. 3B, no leakage occurs between the plurality of IGBTs, and the two NMOS transistors 31 of FIG. 4 can be replaced by the IGBTs of the present structure respectively. Although the above description is made on the basis of the first embodiment, it is possible to replace an NMOSFET with an IGBT in the fourth through eighth embodiments, providing almost the same effects as in the case of replacement in the first embodiment.

What is claimed is:

1. A semiconductor device comprising:
an N⁻ region formed in a surface region of a P type substrate,
a P region formed in the surface region, the P region included in the N⁻ region or adjacent to the N⁻ region,
one or more semiconductor elements, each having a first N type region and a second N type region formed in a portion of said P region, the first N type region and the second N type region being separated from each other, a first electrode formed on said first N type region, a second electrode formed on said second N type region, and a gate electrode formed over a surface of said P region between said first N type region and said second N type region,
wherein said first N type region and said second N type region are surrounded by said P region and separated from said N⁻ region.

2. The semiconductor device according to claim 1 comprising:
a level shift circuit having one of said semiconductor elements, a floating power source electrode apart from the P region on the N⁻ region and a resistor connected between said second electrode and said floating power source electrode.

3. The semiconductor device according to claim 2 comprising:
an another level shift circuit having another semiconductor element, another floating power source electrode apart from the P region on the N⁻ region and another resistor connected between said second electrode and said another floating power source electrode.

4. The semiconductor device according to claim 3, wherein the P region is separated in the N⁻ region to correspond each of the semiconductor elements.

5. The semiconductor device according to claim 2, wherein the P region has a first P region for the first N type region and a second P region for the second N type region.

6. The semiconductor device according to claim 5, comprising a third P region connected to the second P region, wherein the P region is positioned between a second electrode and the floating power source electrode.

7. The semiconductor device according to claim 6, comprising an N⁺ layer between the P type substrate and the N⁻ region, the N⁺ layer contacting with the third P region.

8. The semiconductor device according to claim 1, wherein the N⁻ region is N type diffusion layer formed by diffusing an N type impurity from the surface of the P type substrate and the P region is the surface region of the P type substrate.

9. The semiconductor device according to claim 1, comprising an N⁻ buried region between the P region and the P type substrate.

10. A semiconductor device comprising:
an N⁻ region formed in a surface region of a P type substrate,
a P region formed in the surface region, the P region included in the N⁻ region or adjacent to the N⁻ region,
one or more semiconductor elements, each having a first N type region and a second N type region formed in a portion of said P region, the first N type region and the second N type region being separated from each other, a P+ region formed in a part of the second N type region, a first electrode formed on said first N type region, a second electrode being connected to the P+ region, and a gate electrode formed over a surface of said P region between said first N type region and said second N type region,
wherein said first N type region and said second N type region are surrounded by said P region and separated from said N⁻ region.

11. The semiconductor device according to claim 1, comprising N-resurf region between the second N type region and the gate electrode, wherein the N⁻ region and the P region are positioned between the N-resurf region and the P type substrate in the order from the P type substrate, and wherein a impurity concentration of the N⁻ region on the P substrate, a impurity concentration of the P type region and a impurity concentration of the N-resurf region are set so as to equalize a surface electric field.

12. The semiconductor device according to claim 11, comprising a stack structure adjacent to the semiconductor element, the stack structure being made by stacking a first N type layer, a P type layer and a second N type layer in the order from the P type substrate, wherein a impurity concentration of the first N type layer, a impurity concentration of the P type layer and a impurity concentration of the second N type layer are set so as to equalize a surface electric field.

13. The semiconductor device according to claim 11, wherein a surface of the N⁻ region which is adjacent to the semiconductor element is exposed.

14. The semiconductor device according to claim 3, comprising an N type separation layer in the P type layer positioned between the semiconductor elements.

15. The semiconductor device according to claim 4, comprising a P type separation layer in the N-region positioned between the P regions.

16. The semiconductor device according to claim 9, comprising N type region contacting to the N⁻ buried region, wherein the P type substrate and the P region are separated by the N⁻ buried region and N type region.

* * * * *